United States Patent [19]

Charles

[11] 4,260,853

[45] Apr. 7, 1981

[54] METHOD AND APPARATUS FOR MOUNTING AND ALIGNING ELECTRICAL COMPONENTS

[76] Inventor: Joseph T. Charles, 46 Brinker, Barrington Hills, Ill.

[21] Appl. No.: 71,019

[22] Filed: Aug. 30, 1979

[51] Int. Cl.[3] ........................ H03H 3/00; H01F 17/08

[52] U.S. Cl. ........................................ 178/46; 336/68

[58] Field of Search ...................... 178/45, 46; 336/90, 336/92, 96, 65-68, 199, 208; 174/17 R, 17 CT, 50, 52 R, 52 PE, 52 S

[56] References Cited

U.S. PATENT DOCUMENTS

| | | | |
|---|---|---|---|
| 3,134,854 | 5/1964 | Martin, Jr. et al. | 336/92 X |
| 3,865,980 | 2/1975 | Moser et al. | 178/46 |
| 3,988,707 | 10/1976 | Moser et al. | 178/46 X |

*Primary Examiner*—Marvin L. Nussbaum
*Attorney, Agent, or Firm*—Leydig, Voit, Osann, Mayer & Holt, Ltd.

[57] ABSTRACT

A method and apparatus for mounting and aligning electrical components in a generally cylindrical protective housing including a plurality of generally annular mounting trays having upstanding mounting pins concentrically disposed thereon for receiving annular electrical components with means on the trays for orienting the components on vertically stacked trays in staggered circumferential relation and preferably with radial slits in the trays to permit radial insertion of electrical leads from the outer periphery of the trays to the centrally disposed apertures therein.

20 Claims, 8 Drawing Figures

Fig. 1.
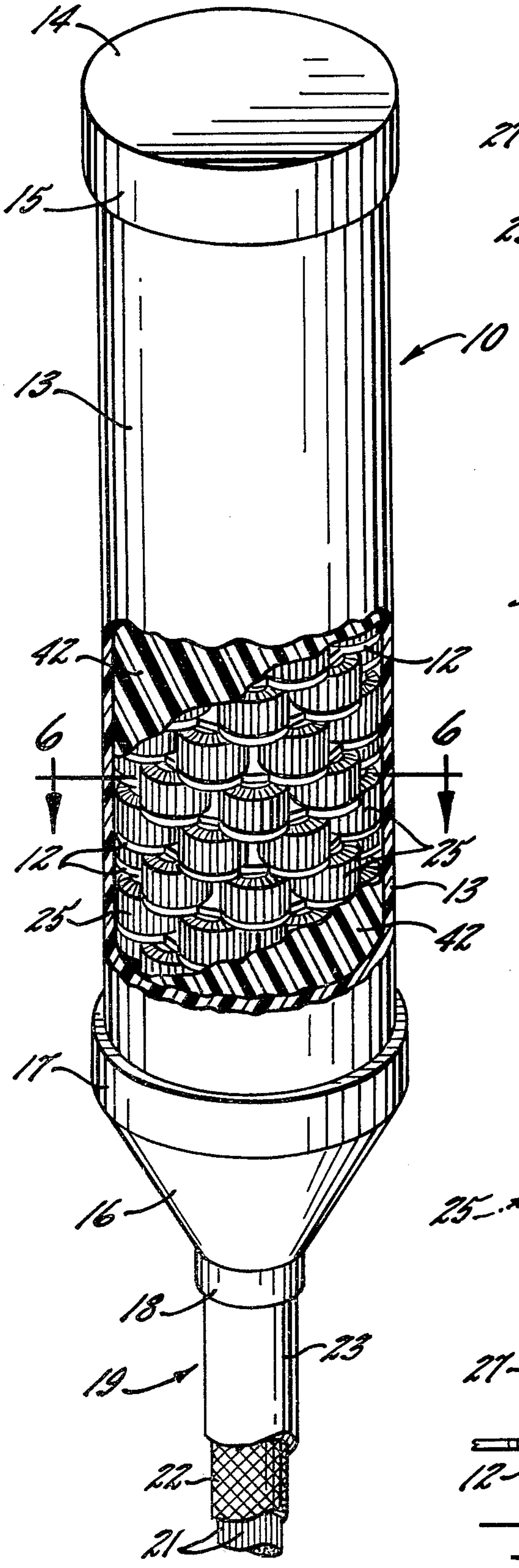
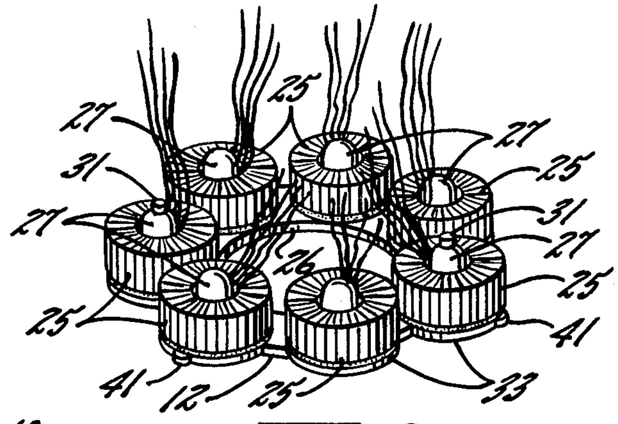
Fig. 2.
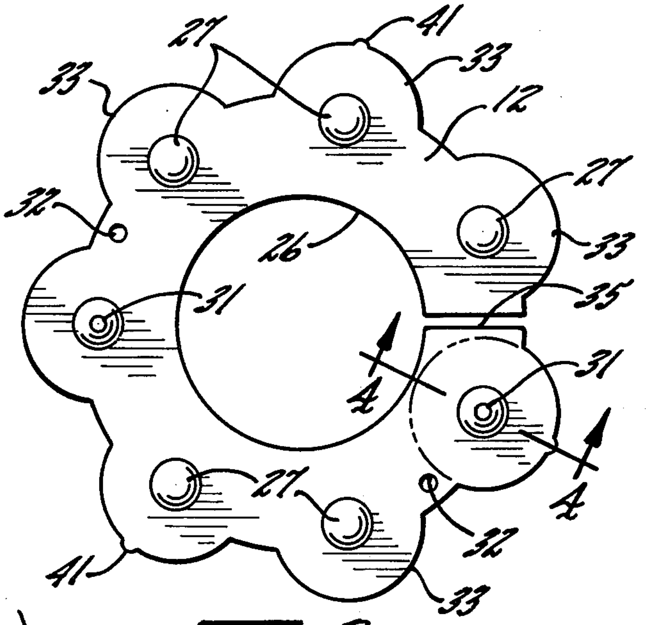
Fig. 3.
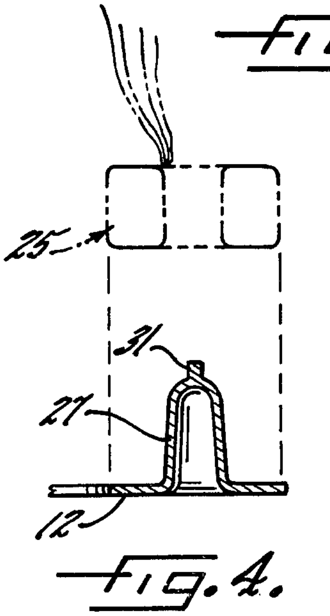
Fig. 4.
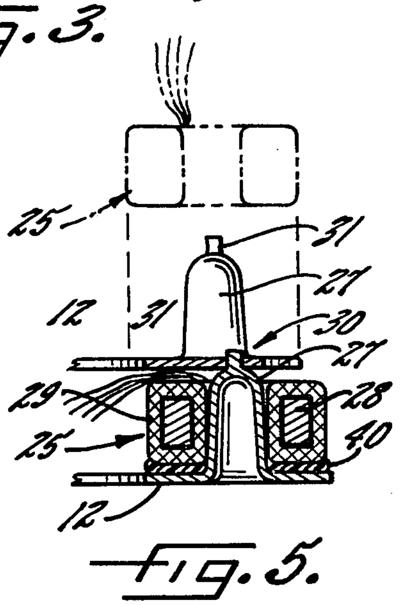
Fig. 5.

METHOD AND APPARATUS FOR MOUNTING AND ALIGNING ELECTRICAL COMPONENTS

The present invention relates generally to component mounting and alignment devices and more particularly concerns trays for mounting and aligning annular electrical components such as load coils or the like for use in communication systems in a highly compact and efficient manner.

It is conventional to connect load coils in telephone communication cables to balance and improve the voice frequency characteristics of pairs of the conductors making up the cable. In the past such load coils have often been individually housed in plastic packages, a plurality of which are then retained in tubular cases. Such an arrangement is shown in U.S. Pat. No. Re. 29,549. This manner of packaging load coils, of course, not only involves the use of the individual plastic packages and the tubular cases but also requires the connection of external lead wires to the internal windings of the load coils such that the lead wires project out of the tubular cases for subsequent connection to the conductors of a communication cable. Such tubular load coil cases are also disposed vertically and encapsulated within a generally cylindrical protection housing. However, due to the nature and configuration of the tubular cases within the cylindrical housings, there are large void spaces between the tubes of load coils which must be filled with an appropriate encapsulating medium or potting compound. As a result, when a substantial number of load coils or the like are encapsulated in this fashion, the outer protective housing tends to be rather heavy and bulky and a large amount of potting compound is required to fill the void spaces in the housing.

In accordance with the present invention there is provided an improved locating and alignment tray for mounting load coils and the like within outer protective casings which reduces the number of parts, the number of connections and the amount of space and encapsulating compound required.

It is one object of the invention to provide such locating and alignment trays on which the components may be mounted in stacked and closely packed relation. A further object is to provide means for orienting the components of adjacently stacked trays in staggered circumferential relation.

A more detailed object is to provide mounting trays as described above in a split annular configuration so they may be quickly and conveniently snapped over a bundle of electrical conductors.

Another object of the invention is to form such mounting and alignment trays of plastic material having a substantially uniform wall thickness throughout to avoid use of excessive material and distortion on cooling and to integrally form therein means for registering and orienting successively stacked trays in circumferentially staggered relation and for locating and guiding said trays in a cylindrical protective housing.

These and other objects and advantages of the invention will become apparent upon reading the following detailed description and upon reference to the drawings, in which:

FIG. 1 is a perspective view of a load coil case employing the mounting and alignment trays of the present invention with certain portions broken away to show the internal construction;

FIG. 2 is a perspective view of one of the mounting and alignment trays of the present invention with a plurality of load coils mounted thereon;

FIG. 3 is a plan view of one of the mounting and alignment trays of the invention;

FIG. 4 is a fragmentary section taken substantially along line 4—4 in FIG. 3 with a load coil shown in broken lines prior to mounting;

FIG. 5 is a fragmentary section similar to FIG. 4 illustrating one load coil mounted on the pin of one locating and alignment tray with a second tray located and registered thereabove to receive another load coil shown in broken lines;

Figure 6:
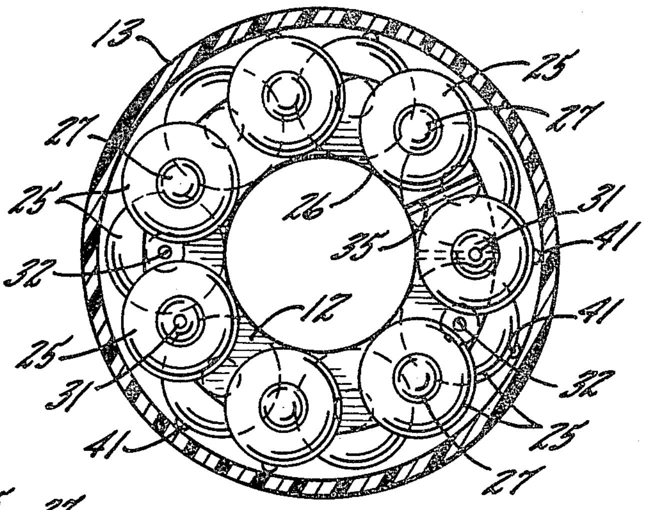
FIG. 6 is a section taken substantially along lines 6—6 in FIG. 1.

Turning now to the drawings, there is shown in FIG. 1 a load coil case 10 incorporating the mounting and alignment trays 12 of the present invention. As shown here the load coil case 10 includes a generally cylindrical housing 13 formed of suitable material such as, for example, polyvinyl chloride plastic. One end of the housing 13 is closed with a generally circular end cap 14 having a depending skirt 15 dimensioned for close fitting and sealing engagement with the end of the housing 13. The other end of the housing 13 is provided with a generally conical cable entrance cap 16 having a skirt 17 dimensioned for close fitting and sealing enagement with the housing 13 and having a necked down end 18 for receiving the stub end of a communication cable 19.

As is conventional, the communication cable 19 includes a plurality of individual electrical leads or conductors 21 surrounded by a protective metallic sheath 22 and encased within an outer plastic sleeve 23. The necked down end 18 of the entrance cap 16 is dimensioned for close fitting and sealing engagement with the outer plastic sleeve 23 of the cable 19.

In accordance with the present invention, means are provided for mounting and aligning a plurality of electrical components, such as load coils 25, in vertically stacked and circumferentially staggered relation within the case 10. As shown in FIGS. 1-6 the mounting and aligning means comprises one or more generally circular trays 12 each with a centrally located aperture 26 therein. A plurality of upstanding mounting pins 27 surround the aperture 26 and are dimensioned to receive and locate the load coils 25 thereon. Preferably, the tray 12 is formed, such as by injection molding, of plastic material for example polystyrene or the like. To minimize the amount of material required and to reduce the amount of distortion on cooling, the pins 27 are desirably made in the form of hollow posts with a wall thickness substantially equal to the thickness of the tray 12.

Each of the load coils 25 is formed with an annular metal ring 28 having two windings of electrical wire 29, as is conventional, to form an "in" and an "out" pair of leads. As shown in the drawings, the wire wound rings are substantially donut shaped and the posts 27 are each dimensioned to receive the opening in the center of one of the load coils. (See for example FIGS. 2, 4 and 5).

Pursuant to the invention, each of the mounting and aligning trays 12 is formed with means 30 for registering vertically disposed trays with their respective posts 27 in off-set or circumferentially staggered relationship. This reduces the induced current between load coils 25 and minimizes "cross-talk" in the conductors. In the illustrative embodiment, the registering means 30 is in the form of projecting nibs 31 on the outer ends of at least a pair of the posts 27. Complementary recesses 32 are formed in each of the trays 12 intermediate the posts 27 to receive the nibs 31 of the next lower tray. Additionally, each of the trays 12 is formed with a series of substantially semicircular lobes 33 which project radially outwardly adjacent the outer periphery of the ring. As shown in FIG. 3, the mounting posts 27 are located substantially at the center of each of the lobes 33.

In accordance with the present invention, the load coils 25 are mounted and aligned on the trays 12 for installation in the protective case 10. To facilitate insertion of the trays 12 around the cable leads 21 the tray is split along a radial line 35 extending from the inner periphery defined by the aperture 26 to the outer periphery at the scalloped edge of the tray 12. This permits the portions of the tray 12 adjacent the slot 35 to be twisted out of the plane of the tray in opposite directions to open the slot for insertion of electrical conductors from the periphery of the tray 12 to the central opening 26.

Figure 7:
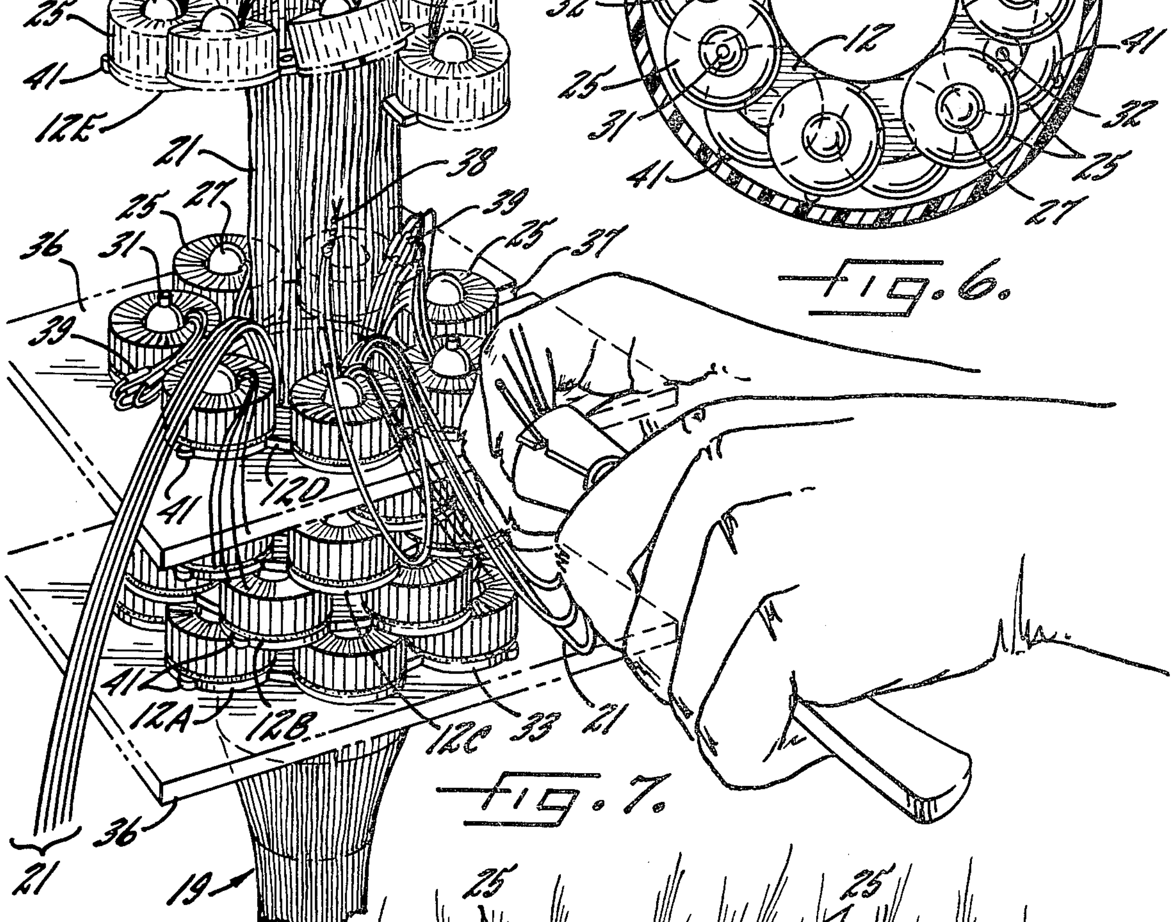
FIG. 7 is a simplified perspective view of load coils installed on the mounting and alignment trays of the present invention with some of the load coils already connected to the electrical leads, others being connected and still others ready to be connected; and, FIG. 8 is a perspective view of another embodiment of the component mounting and alignment tray of the present invention.

Referring now to FIG. 7, the method of assembling the load coil trays 12 is illustrated. The cable stub is shown projecting upwardly with a plurality of individual electrical conductors or leads 21 ready for connection to the respective load coils 25 mounted on the trays 12. Indeed, it will be seen that three trays 12A, 12B and 12C of load coils 25 have already been connected to the electrical leads of the cable 19.

To facilitate connection of the cable leads to the load coil pairs, a temporary support platform 36 having a radial slit 37, similar to the slit 35 in the trays 12, is slipped over the electrical leads to support the tray 12D whose load coils are being connected to the cable conductors. Individual wires from the cable are then selected according to a predetermined color code and the free ends of the wires are stripped of insulation for connection to the respective input and output wires of the individual load coils 25. The ends of the wires are then twisted and soldered together as at 38 and, preferably, a small sleevelike insulation element 39 is slipped over the soldered connection.

After all of the load coils or other components 25 on one tray 12 are connected to the appropriate electrical leads 21 of the cable 19, the platform 36 is removed and the just completed tray 12D is registered with its openings 32 located on the nibs 31 of the next lower tray 12C. This orients the load coils 25 on the adjacent trays 12A–D in circumferentially staggered relation. The platform 36 is then re-inserted over the remaining unconnected leads 21 of the cable and another tray 12E of load coils 25 is snapped over the leads as shown at the upper portion of FIG. 7. To hold the individual load coils 25 on the trays 12 during assembly, they are preferably adhered to the trays 12 with a suitable adhesive 40 as shown in FIG. 5.

When the cable leads 21 are connected to all of the load coils 25 that are to go into the protective case 10, the stacked array of component trays is inserted into the cylindrical housing 13 of the case 10. To help align the trays 12 in the housing 13, the trays 12 are preferably formed with a plurality of projections 41 which extend radially outwardly from certain of the scallops 33. In the illustrated embodiment, each tray is formed with three projections 41 spaced substantially equally circumferentially around the outer periphery of the tray. The projections 41 engage the inner surface of the housing 13 and help guide the trays during insertion.

After the stack of component trays 12 is inserted into the housing 13 the housing is filled with a suitable encapsulating medium or potting compound 42. In this regard, it will be appreciated that the scalloped outer periphery of the trays 12 permits the encapsulating compound to flow down between the trays and the inner wall of the housing and completely fill the void spaces between adjacent trays 12 and load coils 25. Once this is done the end cap 14 is installed and sealed in place at the end of the housing 13. The assembled load coil case 10 is shown in FIG. 1, with certain portions broken away to show the stacked array of the load coil mounting trays 12 of the present invention. A cross sectional view of the assembled case 10 is shown in FIG. 6, with the encapsulating medium omitted for the sake of clarity.

From the foregoing it will be seen that the novel component mounting and alignment trays 12 of the present invention afford a simple and extremely compact method and arrangement for mounting and aligning a plurality of load coils 25 or the like within a cylindrical protective case 10. Furthermore, it will be appreciated that the load coils 25 are mounted directly on the trays 12 thus eliminating the need for individual load coil packages or tubular cases. Also since the cable conductors 21 are connected directly to the "in" and "out" windings of the load coils 25 the need for separate external load coil leads and their requisite connections is also eliminated. Finally, of course, the compact stacking arrangement provided by the staggered trays substantially reduces the size and weight of the load coil case and the amount of encapsulating compound necessary to fill the internal voids. This not only reduces manufacturing costs, but also, leads to savings in storage, shipment and installation charges since smaller and lighter cases may be employed to house a given number of load coils.

The mounting trays 12 illustrated in FIGS. 1–7 have 7 posts 27 and will fit within a 4 in. diameter cylindrical housing 13. For a 25 coil case 10, four such trays 12 can be used (3 posts left open) and can fit in a housing 13 only about 3 in. long. For a 100 count case, 15 trays 12 would be used and the housing would have nominal dimensions of 4 in. diameter and 10 in. length, excluding the end caps 14 and 16.

Figure 8:
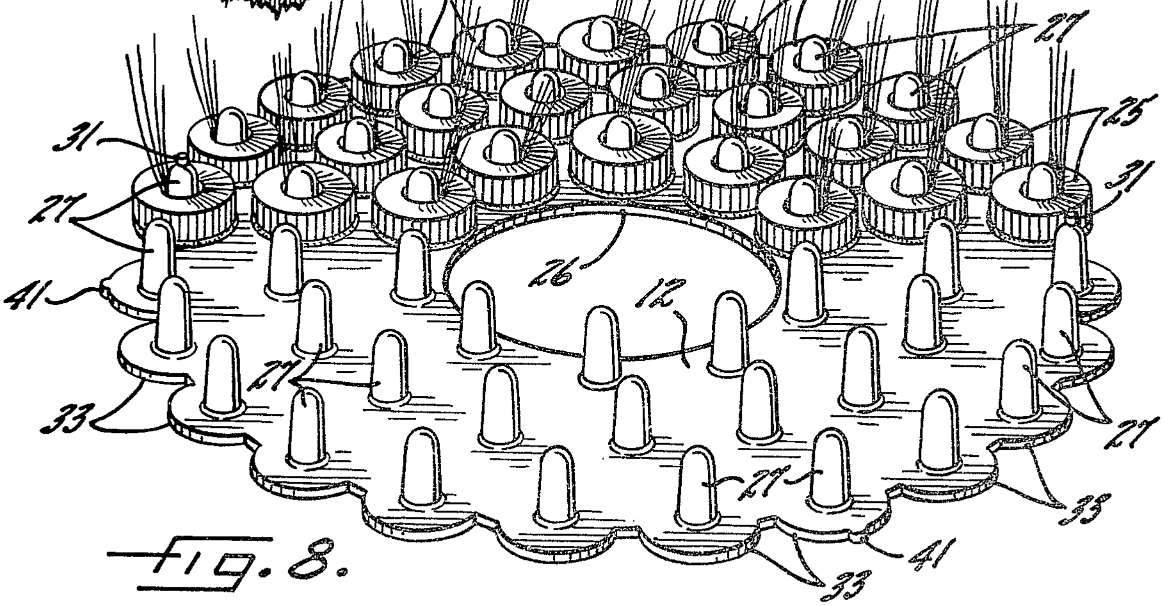

It will be appreciated, of course, that other size mounting trays 12 with different numbers and arrangements of posts 27 may also be formed. Thus a 6 in. diameter tray can be formed with two rows of posts to provide mounting of 13 coils per tray. An 8 in. diameter tray may have two rows of posts with 26 posts per tray. Similarly, a 10 in. diameter tray may be provided with three rows of posts for a total of 50 posts per tray as is illustrated in FIG. 8. Such 50 post trays, of course, provide extremely compact mounting of hundreds, or even thousands, of load coils in an outer housing 13 having rather small overall dimensions. Thus using a 50 post tray, 1500 load coils 25 can be mounted in a 10 in. diameter cylindrical housing only 30 in. long. These examples are merely illustrative and other diameters and post arrangements may also be used without departing from the spirit and scope of the present invention.

I claim as my invention:

1. A mounting and alignment device for annular electrical components for encasement in a cylindrical housing comprising a generally circular tray with a centrally located aperture therein surrounded by a plurality of upstanding mounting pins disposed concentrically around said aperture, each of said pins being dimensioned to locate and receive an annular electrical component thereon and means on said tray for registering a second such tray having upstanding mounting pins thereon with the pins on the two trays disposed in circumferentially staggered relation to one another.

2. A device according to claim 1 wherein said tray is generally in the form of an annulus with a substantially radial slit therein extending from the inner to the outer periphery to permit flexing of said tray and insertion through said slit and into said aperture of a plurality of electrical leads for connection to said components.

3. A device according to claim 1 wherein at least a pair of said pins include nibs at the outer end thereof and said second tray includes a pair of openings disposed between said pins for receiving said nibs.

4. A device according to claim 1 wherein said tray is molded of plastic material and said pins are formed integrally therein with a hollow core and a wall portion of substantially the same thickness as said tray.

5. A device according to claim 1 wherein said pins are disposed in a plurality of concentric rings surrounding said central aperture.

6. A device according to claim 1 wherein said tray is formed with a plurality of generally radially extending substantially semi-circular shaped scallops at the outer periphery of the tray with each of said scallops having one of said mounting pins located substantially centrally thereon.

7. A device according to claim 6 wherein a plurality of said scallops are formed with a radially projecting protrusion for locating and aligning said trays in said cylindrical housing.

8. A method of mounting and aligning annular electrical components in a cylindrical housing comprising the steps of:

a. placing each of a plurality of the components on an upstanding pin disposed concentrically about a centrally located aperture in a generally circular mounting tray;

b. inserting a plurality of pairs of electrical leads through the central aperture, c. connecting predetermined pairs of the leads to the respective components, d. repeating steps a, b and c with respect to additional components and one or more successive mounting trays, e. orienting the successive trays of components in a closely spaced vertical stack with the components on the successive trays disposed in circumferentially staggered relation to one another, and f. installing the vertical stack of mounting trays in said cylindrical housing.

9. The method defined in claim 8 wherein each of the mounting trays includes a plurality of vertically projecting nibs and circumferentially offset apertures and the step of orienting the successive trays in a vertical stack includes the step of registering the projecting nibs of one tray with the apertures of a successive tray.

10. The method defined in claim 8 wherein each of the mounting trays includes a radial slit extending from said central aperture to the outer periphery of the tray and the step of inserting the electrical leads through the aperture includes the preliminary steps of twisting the portions of the tray on either side of said slit out of the plane of the tray in opposite directions and slipping the electrical leads through the slit from the outer periphery of the tray into the central aperture.

11. The method defined in claim 10 wherein the electrical leads form part of a multiple-pair cable and as each successive tray is installed it is twisted and all of the previously unconnected pairs of leads are slipped through the respective slit in each successive tray.

12. The method defined in claim 8 wherein one end of said cylindrical housing is fitted with a cap having an aperture through which said electrical leads are adapted to pass and be sealed and including the additional step of pouring an encapsulating medium into the other end of said housing after said vertical stack of component trays is installed therein.

13. The method defined in claim 12 including the further step of installing and sealing a cap on the other end of said housing after said trays of components are encapsulated in said housing.

14. An electrical component case comprising, in combination, a generally cylindrical protective housing, an apertured cap for sealing one end of said housing and for sealingly receiving a cable having multiple pairs of electrical leads, a plurality of generally circular electrical component mounting trays dimensioned for close fitting relation within said housing, each of said trays having a centrally located aperture therein surrounded by a plurality of upstanding mounting pins disposed concentrically around said aperture, each of said pins being dimensioned to locate said receive an annular electrical component thereon, said mounting trays being disposed in vertically stacked relationship within said housing with the electrical components mounted on successive trays being disposed in circumferentially staggered relation, and means for encapsulating said trays and components within said housing and for sealing the other end of said housing.

15. A device according to claim 14 wherein said tray is generally in the form of an annulus with a substantially radial slit therein extending from the inner to the outer periphery to permit flexing of said tray and insertion through said slit and into said aperture of a plurality of electrical leads for connection to said components.

16. A device according to claim 14 wherein at least a pair of said pins include nibs at the outer end thereof and said second tray includes a pair of openings disposed between said pins for receiving said nibs.

17. A device according to claim 14 wherein said tray is molded of plastic material and said pins are formed integrally therein with a hollow core and a wall portion of substantially the same thickness as said tray.

18. A device according to claim 14 wherein said pins are disposed in a plurality of concentric rings surrounding said central aperture.

19. A device according to claim 14 wherein said tray is formed with a plurality of generally radially extending substantially semi-circular shaped scallops at the outer periphery of the tray with each of said scallops having one of said mounting pins located substantially centrally thereon.

20. A device according to claim 19 wherein a plurality of said scallops are formed with a radially projecting protrusion for locating and aligning said trays in said cylindrical housing.

* * * * *